United States Patent
Yu et al.

(10) Patent No.: US 9,319,058 B1
(45) Date of Patent: Apr. 19, 2016

(54) INTERLEAVING ERROR CORRECTION AND ADAPTIVE SAMPLE FREQUENCY HOPPING FOR TIME-INTERLEAVED ANALOG-TO-DIGITAL CONVERTERS

(71) Applicant: Maxim Integrated Products, Inc., San Jose, CA (US)

(72) Inventors: Qian Yu, Santa Clara, CA (US); Shayan Farahvash, Kensington, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/721,287

(22) Filed: May 26, 2015

Related U.S. Application Data

(60) Provisional application No. 62/114,305, filed on Feb. 10, 2015.

(51) Int. Cl.
| | |
|---|---|
| *H03M 1/06* | (2006.01) |
| *H03M 1/12* | (2006.01) |
| *H03L 7/20* | (2006.01) |
| *H03L 7/18* | (2006.01) |

(52) U.S. Cl.
CPC ............... *H03M 1/0626* (2013.01); *H03L 7/18* (2013.01); *H03L 7/20* (2013.01); *H03M 1/121* (2013.01); *H03M 1/129* (2013.01)

(58) Field of Classification Search
CPC ........ H03M 1/06; H03M 1/502; H03K 5/133; H03K 2005/00058; H03K 5/131; H03K 2005/00084
USPC .......................................... 341/118–121, 155
See application file for complete search history.

(56) References Cited

U.S. PATENT DOCUMENTS

| | | | | |
|---|---|---|---|---|
| 5,239,299 | A * | 8/1993 | Apple | H03M 1/06 341/118 |
| 5,933,039 | A * | 8/1999 | Hui | H03K 5/13 327/262 |
| 6,473,013 | B1 * | 10/2002 | Velazquez | H03M 1/1215 341/118 |
| 7,348,914 | B1 * | 3/2008 | Hazanchuk | H03M 1/124 341/110 |
| 7,576,666 | B2 * | 8/2009 | Mayrench | H03M 1/0836 341/118 |
| 7,916,051 | B1 | 3/2011 | Sestok et al. | |
| 8,193,963 | B2 * | 6/2012 | Wang | G04F 10/005 324/76.53 |
| 8,519,875 | B2 | 8/2013 | Straayer et al. | |
| 8,618,972 | B1 * | 12/2013 | Na | H03M 1/06 341/155 |
| 8,698,659 | B2 | 4/2014 | Hovakimyan et al. | |
| 8,730,072 | B2 | 5/2014 | Petigny et al. | |
| 8,872,680 | B2 | 10/2014 | Ali | |
| 8,917,125 | B1 | 12/2014 | Waltari | |
| 9,172,388 | B1 | 10/2015 | Stein et al. | |
| 2005/0062482 | A1 * | 3/2005 | Vincent | G04F 10/005 324/617 |
| 2006/0061399 | A1 * | 3/2006 | Xu | H03K 5/1504 327/287 |

(Continued)

OTHER PUBLICATIONS

U.S. Appl. No. 14/681,604, filed Apr. 8, 2015, Yu et al.

*Primary Examiner* — Linh Nguyen

(57) ABSTRACT

Methods and apparatus for blind detection and correction of interleaving errors using all-digital processing of data output by multiple sub-ADCs of a time-interleaved ADC are disclosed. The methods and apparatus detect and correct frequency-dependent timing and gain mismatches of the sub-ADCs of the time-interleaved ADC using a novel multiple-input multiple-output (MIMO) filter structure. Additionally, a novel adaptive sampling frequency hopping scheme is proposed to achieve uninterrupted data conversion by the time-interleaved ADC during transient time of ADC clock frequency switching.

18 Claims, 11 Drawing Sheets

(56) References Cited

U.S. PATENT DOCUMENTS

2006/0066368 A1* 3/2006 Gabato ............... H03K 5/1504
327/158

2008/0290924 A1* 11/2008 Gonzalez ............... H03K 5/131
327/276

2012/0013493 A1* 1/2012 Kato ................... H03M 1/0619
341/120

* cited by examiner

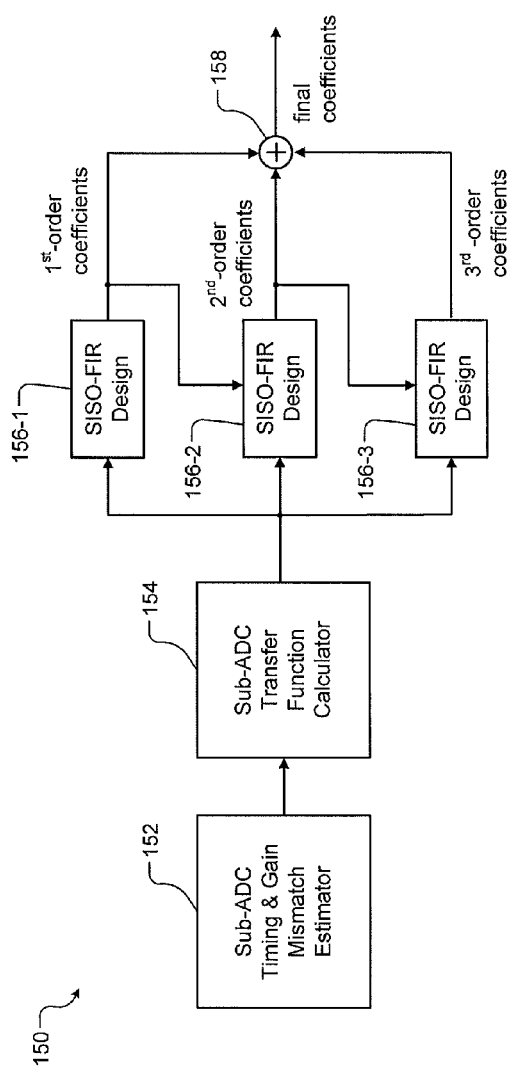
FIG. 3
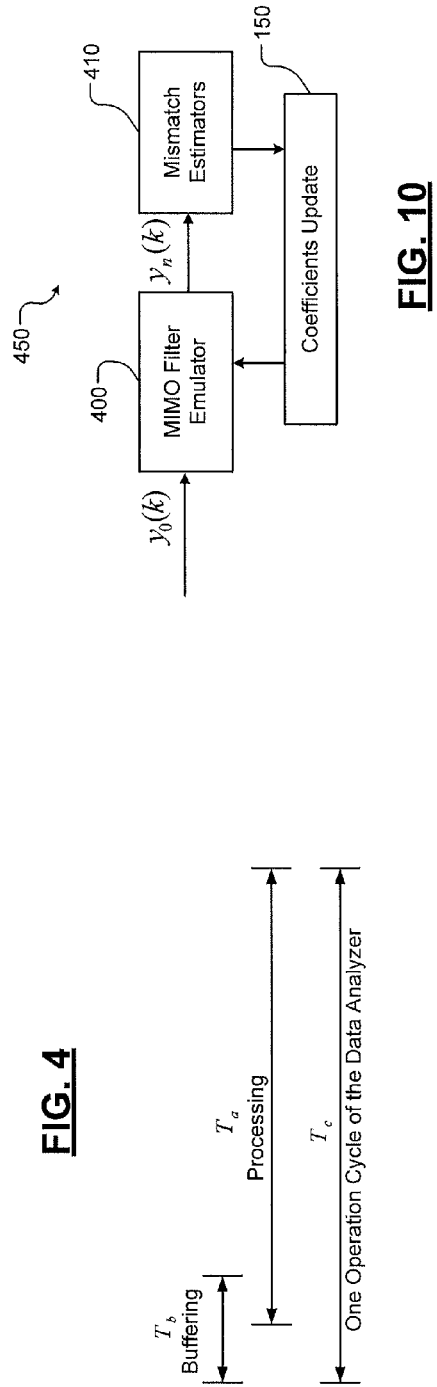
FIG. 10
FIG. 4 ical-to-digital converters (sub-ADCs) of an interleaved ADC, where D and M are integers greater than 1. The first selector selects n of M outputs of a last one of the D delay cells. The second selector selects n of M inputs of a first one of the D delay cells. The first multiplexer multiplexes outputs of the first and second selectors and (D−1) of the D delay cells and generates N outputs, where N=(D−1)M+2n, and 1≤n≤M. The third selector has M output ports, each port selecting L of the N outputs, where L=N+1−M. Each of the M product generators generates a product of an output of one of the M output ports and a corresponding coefficient. The second multiplexer multiplexes M products of the M product generators and generates a correction signal to correct errors in the input signal. The adder adds the correction signal to an output of one of the D delay cells to generate a corrected signal.

INTERLEAVING ERROR CORRECTION AND ADAPTIVE SAMPLE FREQUENCY HOPPING FOR TIME-INTERLEAVED ANALOG-TO-DIGITAL CONVERTERS

CROSS-REFERENCE TO RELATED APPLICATIONS

This application claims the benefit of U.S. Provisional Application No. 62/114,305, filed on Feb. 10, 2015. The entire disclosure of the application referenced above is incorporated herein by reference.

FIELD

The present disclosure relates to analog-to-digital converters (ADCs), and more particularly to systems and methods for correcting frequency-dependent interleaving errors in ADCs.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A time-interleaved analog-to-digital converter (ADC) includes multiple sub-ADCs that operate in parallel. Interleaving errors may be caused by mismatches in the parallel sub-ADCs. More particularly, the parallel sub-ADCs of the time-interleaved ADC have timing and gain mismatches. The mismatches may be frequency-dependent (i.e., may depend on a frequency of a signal being converted by the time-interleaved ADC).

SUMMARY

A multiple-input multiple-output (MIMO) filter comprises a delay line, a first selector, a second selector, a first multiplexer, a third selector, M product generators, a second multiplexer, and an adder. The delay line including D delay cells receives an input signal including M outputs of M sub-ana- In other features, the delay line is a tapped delay line, each delay cell is a unit delay cell, and D is an even number.

In another feature, each of the M output ports of the third selector sequentially selects L of the N outputs.

In another feature, the MIMO filter further comprises an estimator that estimates the errors and that determines an order of the coefficients based on the estimated errors.

In another feature, the MIMO filter further comprises a coefficient generator that generates first order coefficients for a group of single-input single output (SISO) filters and that generates higher order coefficients for the MIMO filter iteratively from the first order coefficients.

In another feature, the MIMO filter further comprises a coefficient generator that generates the coefficients using a QR-decomposition performed once for a single-input single output (SISO) component of the MIMO filter.

In other features, the MIMO filter further comprises an estimator, a transfer function calculator, a first coefficient generator, a second coefficient generator, and a summing circuit. The estimator estimates the errors. The transfer function calculator calculates transfer functions of the sub-ADCs based on the estimated errors. The first coefficient generator generates first order coefficients for a group of single-input single output (SISO) filters. The second coefficient generator generates second order coefficients from the first order coefficients. The summing circuit sums the first and second order coefficients to generate the coefficients for the MIMO filter.

In other features, the MIMO filter further comprises an estimator that estimates a timing mismatch in the input signal when the errors depend on a frequency of a signal being converted by the interleaved ADC. The estimator comprises a multi-band stop filter, a single-band differentiator, and a correlator. The multi-band stop filter selects out-of-band components from outputs of the M sub-analog-to-digital converters (sub-ADCs) of an interleaved ADC. The single-band differentiator includes a wideband differentiator cascaded with a bandpass filter with a passband tunable to a number of non-overlapping frequency regions. The correlator correlates the outputs of the multi-band stop filter and the single-band differentiator to generate estimates of the timing mismatch in the errors.

In other features, the multi-band stop filter includes a type-I linear phase finite impulse response (FIR) filter having an odd length and symmetric coefficients, and the single-band differentiator includes a type-III linear phase FIR filter having an odd length and asymmetric coefficients.

In other features, the MIMO filter further comprises an estimator that estimates a gain mismatch in the input signal when the errors depend on a frequency of a signal being converted by the interleaved ADC. The estimator comprises a multi-band stop filter, a single-band-pass filter, and a correlator. The multi-band stop filter selects out-of-band components from outputs of the M sub-analog-to-digital converters (sub-ADCs) of an interleaved ADC. The single-band-pass filter is tunable to a number of non-overlapping frequency regions. The correlator correlates the outputs of the multi-band stop filter and the single-band-pass filter to generate estimates of the gain mismatch in the errors.

In other features, the multi-band stop filter includes a type-I linear phase finite impulse response (FIR) filter having an odd length and symmetric coefficients, and the single-band-pass filter includes a type-I linear phase FIR filter.

In other features, the MIMO filter further comprises an estimator, an analyzer, and an offset corrector. The estimator estimates mean and variance of the outputs of the M sub-ADCs. The analyzer analyzes the corrected signal and the estimates of the mean and variance of the outputs of the M sub-ADCs and generates offset corrections for the outputs of the M sub-ADCs. The offset corrector corrects offsets in the outputs of the M sub-ADCs based on the offset corrections and generates the input signal.

In another feature, the analyzer analyzes the corrected signal by buffering and processing the corrected signal every T seconds and updates the offset corrections and the coefficients after every T seconds to correct the errors.

In other features, the MIMO filter further comprises an estimator, an analyzer, and an offset corrector. The estimator estimates mean and variance of the outputs of the M sub-ADCs. The offset corrector corrects offsets in the outputs of the M sub-ADCs and generates the input signal. The analyzer analyzes the input signal and the estimates of the mean and variance of the outputs of the M sub-ADCs and generates offset corrections for the offset corrector to correct the offsets in the outputs of the M sub-ADCs.

In another feature, the analyzer analyzes the input signal by buffering and processing the input signal every T seconds and updates the offset corrections and the coefficients after every T seconds to correct the errors.

In other features, the MIMO filter further comprises an emulator, an estimator, and a coefficient generator. The emulator emulates the MIMO filter and processes stored data of the input signal at a lower processing rate than the MIMO filter. The estimator estimates errors in the stored data. The coefficient generator generates filter coefficients for the emulator based on the estimated errors. The emulator uses the filter coefficients to correct the errors in the stored data and stores the corrected input signal. The estimator estimates errors in the corrected input signal. The coefficient generator updates the filter coefficients based on the errors in the corrected input signal. The MIMO filter uses the updated coefficients as the coefficients to correct the errors in the input signal.

In other features, the interleaved ADC samples a signal at a sampling frequency, and the MIMO filter further comprises a converter that converts the sampling frequency into a predetermined frequency and that changes the sampling frequency without changing the predetermined frequency in response to the signal including an unwanted signal at a multiple of the sampling frequency. The interleaved ADC converts the signal without interruption during the change in the sampling frequency.

In other features, the converter changes the sampling frequency by a predetermined amount, and the MIMO filter further comprises a phase-locked loop (PLL) frequency synthesizer and a model generator. The PLL frequency synthesizer includes a voltage controlled oscillator (VCO) to generate clock signals for the interleaved ADC and the converter. The model generator generates a model of the PLL frequency synthesizer and predicts a variation of a VCO frequency with time during switching of the PLL frequency synthesizer when the sampling frequency changes by the predetermined amount. The converter adjusts a frequency conversion ratio based on the model during the switching of the PLL frequency synthesizer without interrupting the interleaved ADC.

In still other features, a system comprises an interleaved analog-to-digital converter (ADC) that samples an input signal at a sampling frequency, and a converter that converts the sampling frequency into a predetermined frequency and that changes the sampling frequency without changing the predetermined frequency in response to the input signal including an unwanted signal at a multiple of the sampling frequency. The interleaved ADC converts the input signal without interruption during the change in the sampling frequency.

In other features, the converter changes the sampling frequency by a predetermined amount, and the system further comprises a phase-locked loop (PLL) frequency synthesizer and a model generator. The PLL frequency synthesizer includes a voltage controlled oscillator (VCO) to generate clock signals for the interleaved ADC and the converter. The model generator generates a model of the PLL frequency synthesizer and predicts a variation of a VCO frequency with time during switching of the PLL frequency synthesizer when the sampling frequency changes by the predetermined amount. The converter adjusts a frequency conversion ratio based on the model during the switching of the PLL frequency synthesizer without interrupting the interleaved ADC.

In other features, the system further comprises a phase-locked loop (PLL) frequency synthesizer, a first frequency divider, a frequency shifter, and a second frequency divider. The PLL frequency synthesizer includes a voltage controlled oscillator (VCO) to generate clock signals for the interleaved ADC and the converter. The first frequency divider divides an output of the PLL frequency synthesizer by a predetermined value to generate a first clock signal for the converter. The frequency shifter shifts a frequency of the output of the PLL frequency synthesizer by a predetermined amount. The second frequency divider divides an output of the frequency shifter by the predetermined value to generate a second clock signal for the converter.

In still other features, a system comprises an estimator, a transfer function calculator, a first coefficient generator, a second coefficient generator, and a summing circuit. The estimator estimates errors in an input signal including M outputs of M sub-analog-to-digital converters (sub-ADCs) of an interleaved ADC, where M is an integer greater than 1. The transfer function calculator calculates transfer functions of the sub-ADCs based on the estimated errors. The first coefficient generator generates first order coefficients for a group of single-input single output (SISO) filters. The second coefficient generator generates second order coefficients from the first order coefficients. The summing circuit sums the first and second order coefficients to generate a plurality of coefficients for a multiple-input multiple-output (MIMO) filter that generates a correction signal to correct the errors in the input signal.

In other features, the system further comprising the MIMO filter that includes a delay line, a first selector, a second selector, a first multiplexer, a third selector, M product generators, a second multiplexer, and an adder. The delay line includes D delay cells and receives the input signal, where D is an integer greater than 1. The first selector selects n of M outputs of a last one of the D delay cells. The second selector selects n of M inputs of a first one of the D delay cells. The first multiplexer multiplexes outputs of the first and second selectors and (D−1) of the D delay cells and generates N outputs, where N=(D−1)M+2n, and 1≤n≤M. The third selector has M output ports each selecting L of the N outputs, where L=N+1−M. The M product generators each generate a product of an output of one of the M output ports and a corresponding coefficient of the plurality of coefficients. The second multiplexer multiplexes M products of the M product generators and generates the correction signal. The adder adds the correction signal to an output of one of the D delay cells to generate a corrected signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 depicts an example of a MIMO filter-design subsystem.

FIG. 4 illustrates an operation cycle of an ADC data analyzer used in the system of FIG. 1.

FIG. 10 depicts an example of an iterative mismatch detection and correction system.

In the drawings, reference numbers may be reused to identify similar and/or identical elements.

DETAILED DESCRIPTION

The present disclosure presents methods and apparatus for blind detection and correction of interleaving errors using all-digital processing of data output by multiple sub-ADCs of a time-interleaved ADC. Specifically, the methods and apparatus detect and correct frequency-dependent timing and gain mismatches of the sub-ADCs of the time-interleaved ADC using a novel multiple-input multiple-output (MIMO) filter as described below in detail. Additionally, the methods and apparatus use a novel adaptive sampling frequency hopping scheme described below in detail that can achieve continuous (i.e., uninterrupted) data conversion by the time-interleaved ADC during the transient time of ADC clock frequency switching.

More specifically, the time-interleaved ADC can be modeled as a multiple-input multiple-output (MIMO) filter. The interleaving errors of the time-interleaved ADC can be compensated for by a digital MIMO filter, which is essentially an inverse filter of the time-interleaved ADC's MIMO filter model. Designing digital filters to correct interleaving errors due to frequency-dependent gain/timing mismatches is a complex problem. The present disclosure uses a MIMO correction-filter structure and shows that the optimal correction-filter design can be reduced to decoupled single-input-single-output (SISO) finite impulse response (FIR) filter design problems. This simplified approach enables optimal design and redesign of the correction filter with a low computational complexity to support real-time adaptation of the correction filter. The present disclosure uses generalized methods that can account for frequency-dependent gain and timing mismatches. To avoid limitations of blind sub-ADC-mismatch detection, adaptive frequency hopping of ADC's sampling clock frequency is proposed. The present disclosure uses a novel method that can achieve continuous (i.e., uninterrupted) data conversion during the transient time of ADC clock frequency switching.

Figure 1:
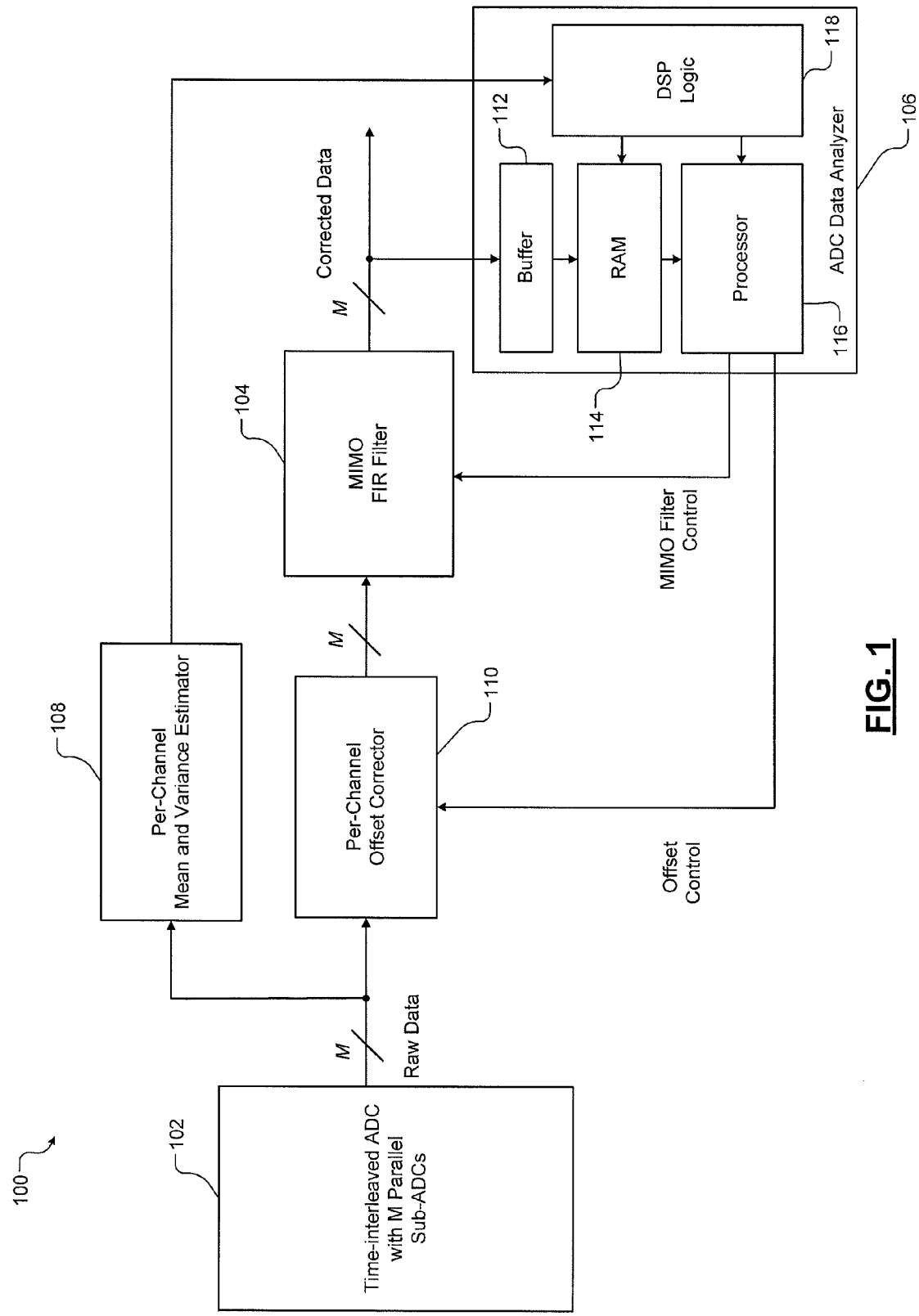
FIG. 1 is a block diagram of a system for detecting and correcting interleaving mismatch errors of a time-interleaved analog-to-digital converter (ADC)

FIG. 1 shows a system 100 for detecting and correcting interleaving mismatch errors of a time-interleaved ADC according to the present disclosure. In the system 100, mixed signal circuits of a time-interleaved ADC are integrated with digital circuits for interleaving error detection and correction on a mixed-signal system-on-chip. The system 100 includes a time-interleaved ADC 102, a MIMO FIR filter 104, an ADC data analyzer 106, a mean and variance estimator 108, and an offset corrector 110.

The time-interleaved ADC 102 uses multiple sub-ADCs running in parallel. The number of sub-ADCs, denoted by M, is an arbitrary integer within a range, say, from 2 to 32. The raw output data of the sub-ADCs have M parallel channels, each channel corresponding to one sub-ADC. The raw data can be represented as a vector-valued sequence with a sampling rate equal to a sub-ADC sampling rate, $F_s/M$, where $F_s$ is a sampling rate of the time-interleaved ADC 102.

The offset corrector 110 is a per-channel offset corrector and performs element-wise addition of an offset vector with the raw data. The MIMO FIR filter 104 is used to correct gain and timing mismatches of the sub-ADCs. The mean-and-variance estimator 108 is a per-channel mean-and-variance estimator and performs a moving-average measurement of the mean and variance of each channel.

The ADC data analyzer 106 is a digital subsystem that has an embedded processor 116, memory including a buffer 112 and RAM 114, and dedicated circuits for digital signal processing (DSP) denoted as DSP logic (or DSP module) 118. Various tasks for data analysis and digital control are performed by embedded software with hardware acceleration of the DSP logic 118.

Figure 2:
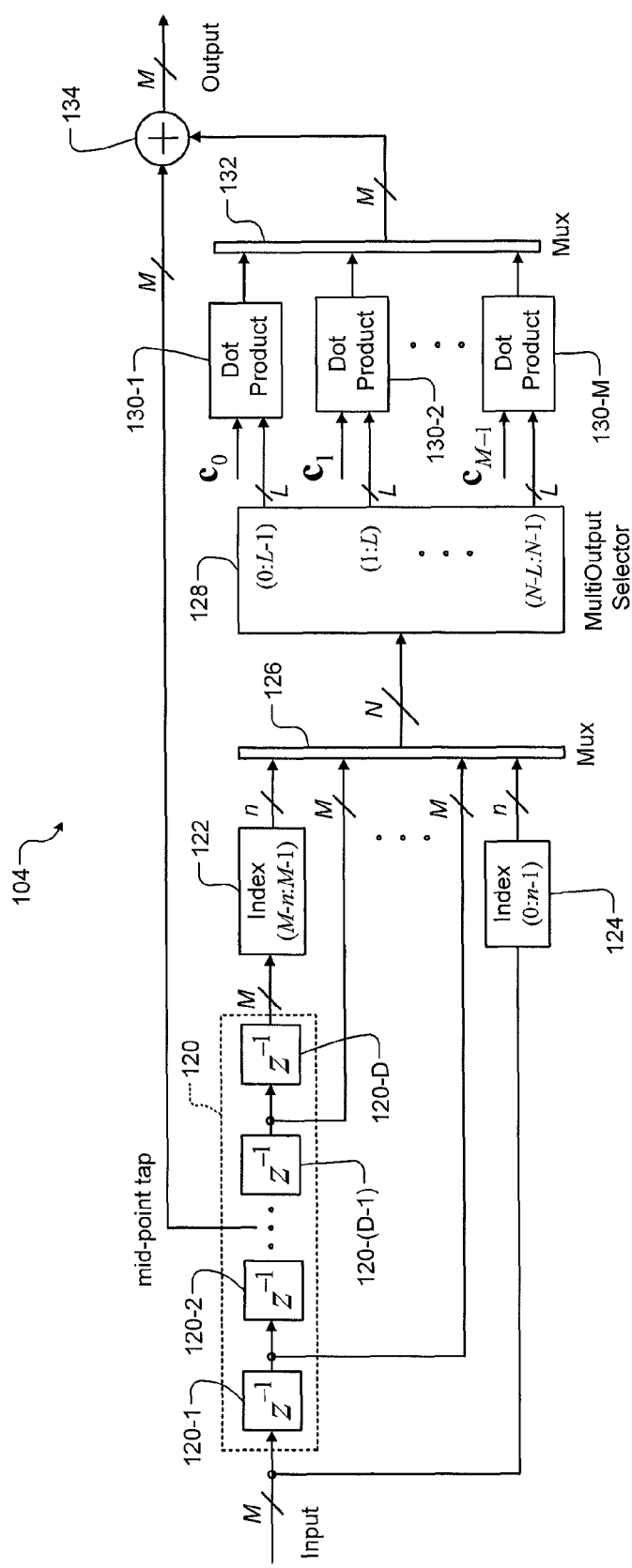
FIG. 2 is a block diagram of a multiple-input multiple-output (MIMO) filter used in the system of FIG. 1.

FIG. 2 shows the MIMO FIR filter 104 in detail. The MIMO FIR filter 104 includes in delay line 120, a first selector 122, a second selector 124, a first multiplexer 126, a third selector 128, a plurality of product generators 130-1, 130-2, ..., 130-M (collectively product generators 130), a second multiplexer 132, and an adder 134.

The input and output of the MIMO FIR filter 104 are vector-valued sequences with a vector size M and a sequence rate $F_s/M$, where M is an integer greater than 1. The delay line 120 is a tapped delay line that includes an even number of unit-delay cells 120-1, 120-2, ... 120-D (collectively delay line 120), where D is an integer greater than 1. The first selector 122 selects n of M outputs of a last one of the D delay cells of the delay line 120. The second selector 124 selects n of M inputs to a first one of the D delay cells of the delay line 120. A total of D+1 vectors tapped from the delay line 120 are multiplexed by the first multiplexer 126 to a single vector of size N. In the first and the last tapped vectors, elements can be partially selected such that $N=(D-1)M+2n$, $1 \leq n \leq M$.

The third selector 128 is a multi-output selector having M output ports. Each output port selects $L=N+1-M$ elements from the N elements of the input vector. For example, a first output port of the third selector 128 selects input vector elements indexed from 0 to $L-1$, a last output port of the third selector 128 selects elements indexed from $N-L$ to $N-1$. In some circuit implementations, the third selector 128 can use a tree structure to limit fan-out.

The MIMO FIR filter 104 has a total of LM coefficients stored in M coefficient vectors. Each of the M product generators 130 generates a product of an output of one of the M output ports of the third selector 128 and a corresponding coefficient of the MIMO FIR filter 104. The dot product of one of the selector outputs $v_m=[v_{ml}]_{l=0}^{L-1}$ and one of the coefficient vectors $c_m=[c_{ml}]_{l=0}^{L-1}$ is given by:

$$v_m \cdot c_m = \sum_{\ell=0}^{L-1} v_{m\ell} c_{m\ell}, \text{ for } m = 0, \ldots, M-1$$

The second multiplexer 132 multiplexes the M dot product values output by the M product generators 130. The output of the second multiplexer 132 is a vector valued correction sequence. The adder 134 adds the correction sequence to a midpoint tap of the delay line 120, which is a delayed copy of the input to the MIMO FIR filter 104 and generates a corrected signal. The corrected signal is compensated for the mismatches of the time-interleaved ADC 102.

In theory, the first multiplexer 126, the third selector 128, and the M product generators 130 perform instantaneous operations on vector signals, and the correction sequence is delay-matched with the mid-point tap of the delay line 120. Since D is designed as an even number, the delay line 120 has a mid-point tap with an integer delay of D/2. Accordingly, an extra integer delay can be provided in practice to match the delays of the first multiplexer 126, the third selector 128, and the M product generators 130.

A novel filter design method is used for the MIMO FIR filter 104. Assume that the ADC input signal is a complex-valued single-frequency signal. In the ideal case without sub-ADC mismatches, the ADC data are interleaved to a scalar sequence $e^{j\omega k}$, where k is integer-valued discrete time, and $\omega$ is a normalized angular frequency. The sampling rate is $F_s$ for such k-indexed sequences. Complex-valued frequency responses of sub-ADCs are denoted by $H_m(j\omega)$, for $m=0, \ldots, M-1$. The interleaved data sequence before correction can be expressed as $$x(k;\omega)=e^{j\omega k} \cdot H_{mod(k,M)}(j\omega)$$

Interleaving errors are caused by transfer function mismatches of the sub-ADCs, which include both gain and timing mismatches (frequency dependent or not). The MIMO FIR filter 104 is designed to correct the interleaved sequence back to the original $e^{j\omega k}$ sequence.

The MIMO FIR filter 104 has M coefficient vectors. Each coefficient vector is decomposed as $$c_m = c_m^{(1)} + c_m^{(2)} + c_m^{(3)} + \ldots, \text{ for } m=0,\ldots,M-1$$

where vector $c_m^{(p)}=[c_{ml}^{(p)}]_{l=0}^{L-1}$ is a p-th order component of a $c_m$ vector. The first-order coefficient vectors $c_m^{(1)}$ are determined by solving single-input-single-output (SISO) FIR design problems given by a first equation:

$$\sum_{\ell=0}^{L-1} c_{m\ell}^{(1)} e^{-j\omega(\ell-J)} = 1 - H_m(j\omega), \text{ for } m = 0, \ldots, M-1$$

where J=(L−1)/2. Higher-order coefficient vectors are determined iteratively by solving the SISO-FIR design problems using a second equation:

$$\sum_{\ell=0}^{L-1} c_{m\ell}^{(p)} e^{-j\omega(\ell-J)} = \sum_{\ell=0}^{L-1} c_{m\ell}^{(p-1)} e^{-j\omega(\ell-J)}[1 - H_{mod(m-\ell+J,M)}(j\omega)], \, p = 2, 3, \ldots$$

Each SISO-FIR design problem in the above two equations requires designing time-domain coefficients to meet a specified frequency response. In case of small mismatches, a first-order correction (using only first-order coefficients) can already meet performance requirement. Higher-order corrections are required to correct large mismatches. As a rule of thumb, each order of coefficients can provide roughly 20 dB improvement of the signal-to-distortion ratio.

Designing digital filters that can correct interleaving errors due to frequency-dependent gain/timing mismatches has been a rather complex and elaborate process. The present disclosure shows that the correction-filter design can be reduced to decoupled problems of SISO-FIR filter design. The frequency response of each impulse $[c_{ml}^{(p)}]_{l=0}^{L-1}$ of length L on a pre-selected frequency grid (i.e., pre-selected number of points in a frequency range) is given by one of the above two equations. The $[c_{ml}^{(p)}]_{l=0}^{L-1}$ coefficients can be computed from a least-square method using QR-decomposition. A QR-decomposition is performed once to save Q and R constant matrices in memory. Filter redesign does not need QR-decomposition and hence greatly reduces computational complexity. In case of an equally-spaced frequency grid (i.e., equally spaced number of points in a frequency range), the FIR coefficients may also be computed from fast Fourier transforms. Therefore, filter redesign can be performed in a very short time to support real-time adaptation of the MIMO FIR filter 104.

FIG. 3 shows an example of a MIMO filter-design subsystem (i.e., a coefficient generator) 150 that can compute up to third-order coefficients, for example, for the MIMO FIR filter 104. In the example shown, the MIMO filter-design subsystem 150 includes a timing and gain mismatched estimator 152, a transfer function calculator 154, and three coefficient generators 156-1, 156-2, and 156-3 (collectively coefficient generators 156) to compute up to third-order coefficients, for example, for the MIMO FIR filter 104.

The coefficient generators 156 compute the coefficients by solving SISO-FIR filter design problems using the above two equations. Specifically, the first coefficient generator 156-1 computes first-order coefficients. The second coefficient generator 156-2 computes second-order coefficients based on the first-order coefficients computed by the first coefficient generator 156-1. The third coefficient generator 156-3 computes third-order coefficients based on the second-order coefficients computed by the second coefficient generator 156-2.

The timing and gain mismatched estimator 152 estimates sub-ADC gain and timing mismatches from the ADC output data by using a blind detection method described below with references to FIGS. 6 and 7. The transfer function calculator 154 calculates transfer functions of the sub-ADCs from the estimated mismatch values. Then first-order coefficients are computed by solving SISO-FIR design problems using the first equation given above, and higher-order coefficients are computed by solving SISO-FIR design problems using the second equation given above. The adder 158 adds the outputs of the coefficient generators 156 to provide the final coefficients for the MIMO FIR filter 104, which are input to the M product generators 130 in FIG. 2.

Figure 5:
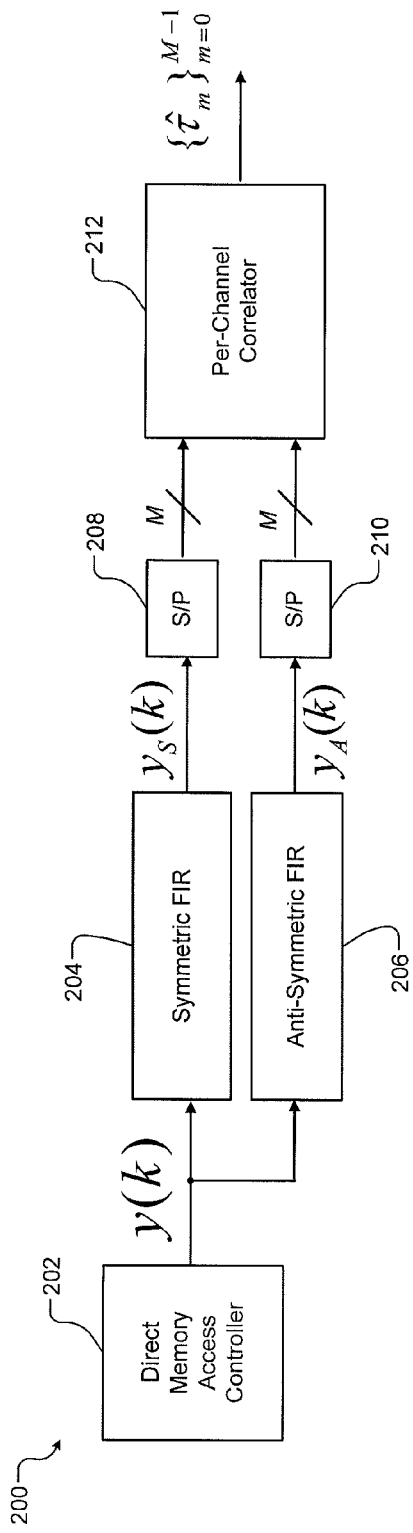
FIG. 5 depicts an example of a system 200 for blind timing skew detection.
Figure 6:
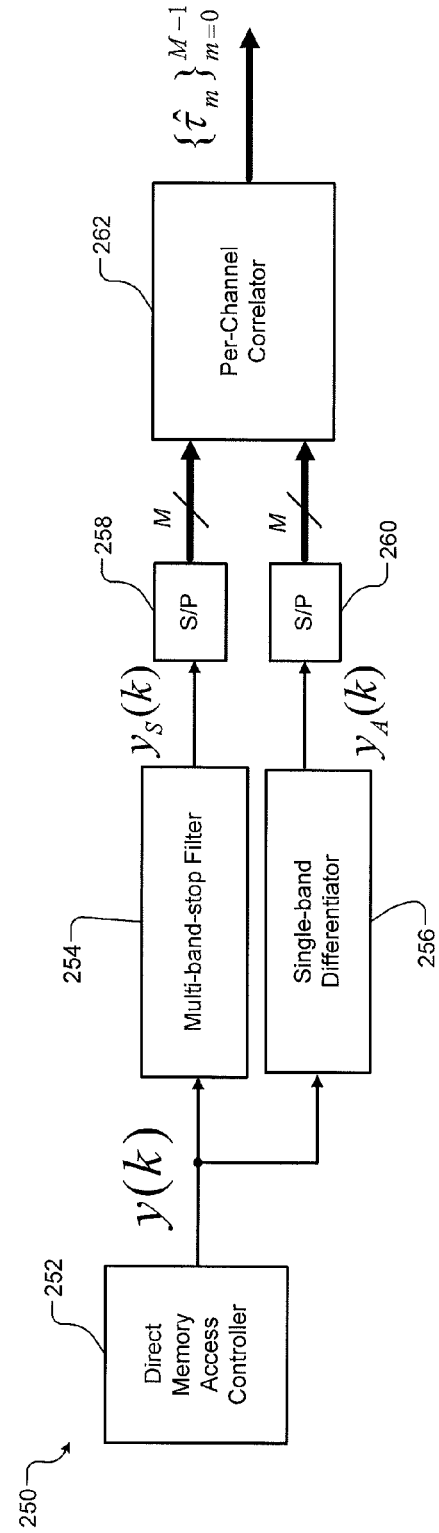
FIG. 6 depicts an example of a frequency-dependent timing mismatch estimator.
Figure 7:
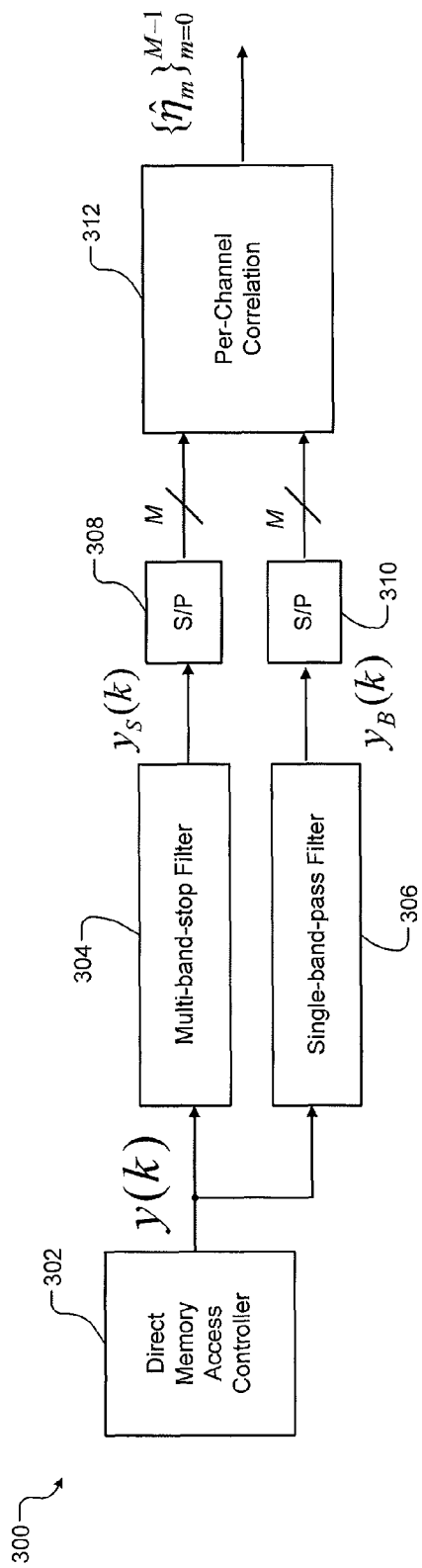
FIG. 7 depicts an example of a frequency-dependent gain mismatch estimator.

FIGS. 4-7 show blind detection of sub-ADC mismatches. Specifically, FIG. 4 shows an operation cycle of the ADC data analyzer 106. FIG. 5 shows an example of blind timing skew detection. FIG. 6 shows an example of frequency-dependent timing mismatch estimation. FIG. 7 shows an example of frequency-dependent gain mismatch estimation.

In FIG. 1, the ADC data analyzer 106 can capture a number of consecutive ADC samples in the buffer 112 and save the data segment in memory 114. Static random access memory (SRAM) is commonly used as embedded memory.

FIG. 4 shows an operation cycle of the ADC data analyzer 106. The operation cycle is referred to as a buffering-processing cycle. A duration of one operation cycle is denoted by $T_c$. Since the ADC data have M parallel channels, a segment of data may be treated as a two-dimensional array y(i,m) with i=0, . . . , I−1 and m=0, . . . , M−1. The data are actually stored in memory 114 as a one-dimensional array y(k) with k=iM+m. The y(k) array is an interleaved sequence whose sampling rate is the sampling rate of the time-interleaved ADC 102, which is $F_s$. Since a data segment has IM samples, the time duration for data buffering is given by $T_b$=IM/$F_s$. The time duration for processing/analyzing a data segment is denoted by $T_a$. Since data analysis may start before a full segment is saved into RAM, $T_b < T_c \leq (T_a + T_b)$.

In FIG. 1, the ADC data analyzer 106 can employ a number of DSP modules 118. Embedded software combined with hardware acceleration is used to implement these DSP modules. For example, one such DSP module can include a power spectral density (PSD) estimator using fast Fourier transforms (FFT) and Welch's averaged periodogram method. A hardware FFT block is used to accelerate the computation. Hardware implementation of the entire PSD estimator is also an option.

FIG. 5 shows an example of a system 200 for blind timing skew detection. The system 200 includes a direct memory access (DMA) controller 202, a symmetric FIR filter 204, an anti-symmetric FIR filter 206, serial-to-parallel (S/P) converters 208 and 210, and a correlator 212. The correlator 212 is a per-channel correlator.

The DMA controller 202 retrieves the y(k) array from the memory 114 and sends the data as an input sequence to a pair of real coefficient, linear phase FIR filters 204 and 206. The symmetric FIR filter 204 has symmetric coefficients, and the anti-symmetric FIR filter 206 has anti-symmetric coefficients. The pair of linear-phase FIR filters 204 and 206 have identical group delay. The output sequences of the symmetric and the anti-symmetric FIR filters 204 and 206 are denoted by $y_S(k)$ and $y_A(k)$, respectively. Per-channel timing skew is estimated from serial-to-parallel (S/P) conversion performed by the serial-to-parallel (S/P) converters 208 and 210, followed by per-channel correlation between the two FIR filter outputs performed by the correlator 212. The output of the system 200, $\{\hat{\tau}_m\}_{m=0}^{M-1}$, can be expressed as $$\hat{\tau}_m = \frac{\text{Mean}\{y_S(iM+m)y_A(iM+m)\}}{\text{Mean}\{y_A^2(iM+m)\}}, \text{ for } m = 0, \ldots, M-1$$

where i=floor(k/M) and Mean{ } is arithmetic averaging over the i-index.

FIG. 6 shows an example of a frequency-dependent timing mismatch estimator 250. The timing mismatch estimator 250 includes a direct memory access (DMA) controller 252, a multi-band-stop filter 254, a single band differentiator 256, serial-to-parallel (S/P) converters 258 and 260, and a correlator 262. The correlator 262 is a per-channel correlator.

For simplicity, suppose that the ADC input signal is band-limited within a single Nyquist zone (e.g., a first-order, second-order, or third-order zone). The multi-band-stop filter 254 is a type-I linear phase FIR filter having an odd length and symmetric coefficients. The single-band differentiator 256 is a type-III linear phase FIR filter having an odd length and anti-symmetric coefficients. The stop bands of the multi-band-stop filter 254 are frequency regions where the y(k) sequence has a significant power spectral density (PSD). The significant-PSD regions, or in-band regions, can be identified by comparing the PSD with a threshold.

The multi-band-stop filter 254 selects the out-of-band components of the y(k) sequence. The single-band differentiator 256 is designed as a wideband differentiator cascaded with a bandpass filter whose passband can be tuned to a number of non-overlapped frequency regions (e.g., different bands of a multi-band signal). The correlator 262 performs per-channel correlations of the two FIR filter outputs after their serial-to-parallel (S/P) conversions. The timing mismatch estimator 250 generates multiple estimates of $\{\hat{\tau}m\}_{m=0}^{M-1}$ under different selections of the differentiator passband. Frequency-dependent timing mismatch is detected from the variation of $\{\hat{\tau}_m\}_{m=0}^{M-1}$ with the passband frequencies.

FIG. 7 shows an example of a frequency-dependent gain mismatch estimator 300. The gain mismatch estimator 300 includes a direct memory access (DMA) controller 302, a multi-band-stop filter 304, a single-band-pass filter 306, serial-to-parallel (S/P) converters 308 and 310, and a correlator 312. The correlator 312 is a per-channel correlator.

The multi-band-stop filter 304 is a type-I linear phase FIR and is the same as the multi-band-stop filter 254 used in the timing mismatch estimator 250 in FIG. 6. The single-band-pass filter is also a type-I linear phase FIR filter and can be tuned to a number of non-overlapped frequency regions (e.g., different bands of a multi-band signal). The output of the gain mismatch estimator 300, $\{\hat{\eta}_m\}_{m=0}^{M-1}$, can be expressed as $$\hat{\eta}_m = \frac{\text{Mean}\{y_S(iM+m)y_B(iM+m)\}}{\text{Mean}\{y_B^2(iM+m-D_s)\}}, \text{ for } m = 0, \ldots, M-1$$

where $y_S(k)$ and $y_B(k)$ are output sequences of the multi-band-stop filter 304 and the single-band-pass filter 306, respectively. An estimated per-channel gain (in linear scale) is $1+\hat{\eta}_m$. The gain mismatch estimator 300 estimates a frequency-dependent gain mismatch from the variation of $\{\hat{\eta}_m\}_{m=0}^{M-1}$ with the passband frequencies of the single-band-pass filter.

In FIG. 1, the embedded software and the embedded processor 116 are used for a real-time control of all-digital correction. Vector-valued control variables include the offset vector and the MIMO coefficient vectors. The update interval of control variables is the time duration of the buffering-processing cycle, i.e., $T_c$, shown in FIG. 4.

In FIG. 1, the ADC data analyzer 106 is coupled to the output of the MIMO FIR filter 104. The system 100 employs feedforward control for offset correction and feedback control for timing and gain correction. The MIMO coefficient vectors are adjusted so that detected timing and gain mismatches become zero. Note that feedback control allows for imprecision in the magnitude of mismatch estimation as long as the sign of mismatch is correctly detected.

Figure 8:
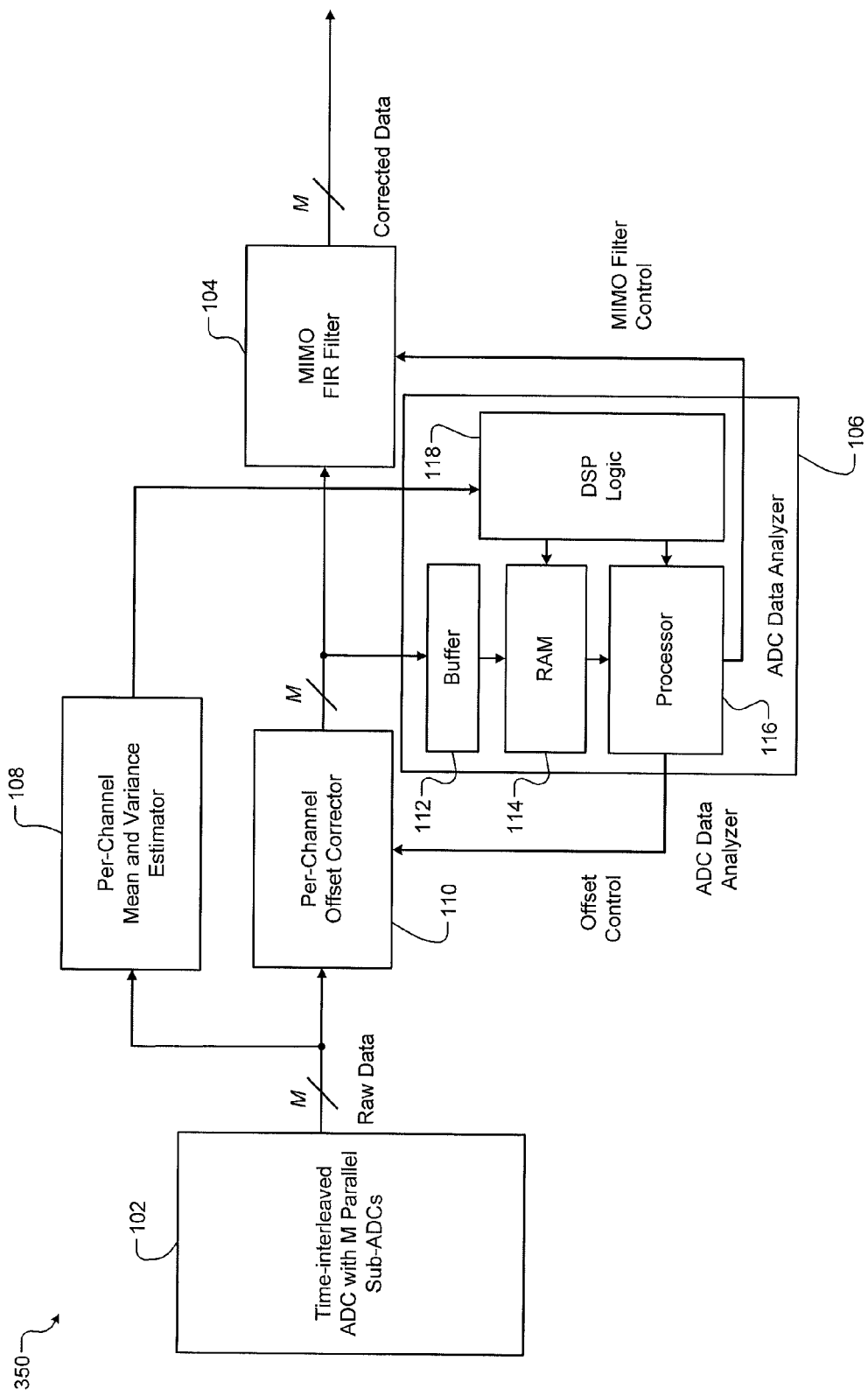
FIG. 8 depicts a variation of the system in FIG. 1, wherein the offset corrector and the MIMO filter are controlled through feedforward control.

FIG. 8 shows a variation of FIG. 1. In FIG. 8, the ADC data analyzer 106 is coupled to the output of the per-channel offset corrector 110. In this configuration, both the offset corrector 110 and the MIMO FIR filter 104 are adjusted through feedforward control. Feedforward correction requires precise mismatch estimation. For precise mismatch estimation, an additional DSP module called a MIMO filter emulator is used.

Figure 9:
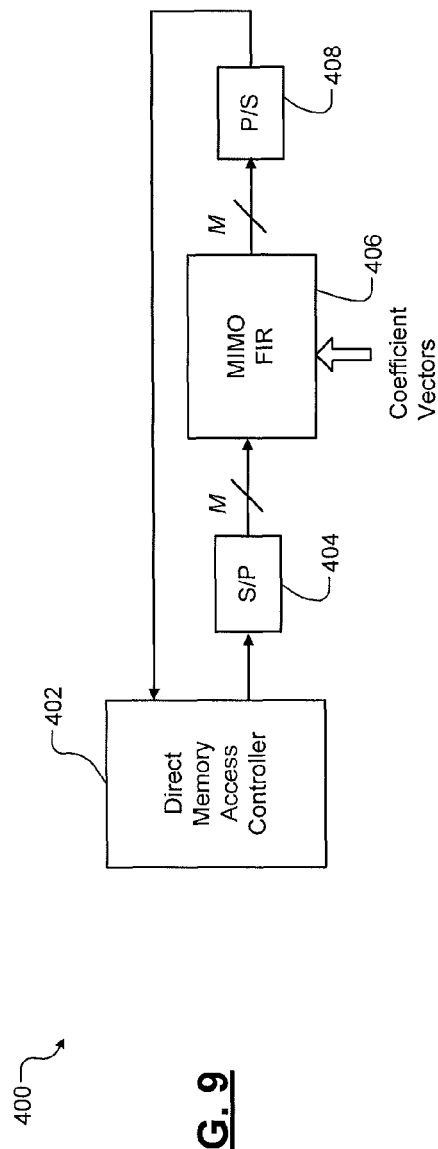
FIG. 9 depicts an example of a MIMO filter emulator.

FIG. 9 shows an example of a MIMO filter emulator 400. The MIMO filter emulator 400 includes a direct memory access (DMA) controller 402, a serial-to-parallel (S/P) converter 404, a MIMO FIR filter 406, and a parallel-to-serial (P/S) converter 408. The MIMO filter emulator 400 can correct the timing/gain mismatches of a segment of data saved in memory 114. The MIMO FIR filter 406 has the same signal-processing structure as the MIMO FIR filter 104 in FIG. 3. However, the MIMO filter emulator 400 can work off-line at a processing rate much lower than the online MIMO FIR filter 104, which helps reduce power consumption and chip area. Precise mismatch estimation can be obtained from iterative mismatch detection and correction.

FIG. 10 shows an example of iterative mismatch detection and correction system 450. The system 450 includes the MIMO filter emulator 400, mismatch estimators 410 including the timing mismatch estimator 250 of FIG. 6 and the gain mismatch estimator 300 of FIG. 7, and the coefficient generator 150 shown in FIG. 3. The ADC data analyzer 106 captures a data segment represented by a one-dimensional array $y_0(k)$. With input data $y_0(k)$, the output data of the MIMO filter emulator 400 are $y_n(k)$ in an n-th iteration. The coefficients of the MIMO filter emulator 400 are initially set to zero and are subsequently updated by the coefficient generator 150 so that estimated timing/gain mismatches in the output of the MIMO filter emulator 400 become sufficiently small after a number of iterations. The online MIMO FIR filter 104 can directly copy the converged coefficients of the MIMO filter emulator 400.

Figure 11:
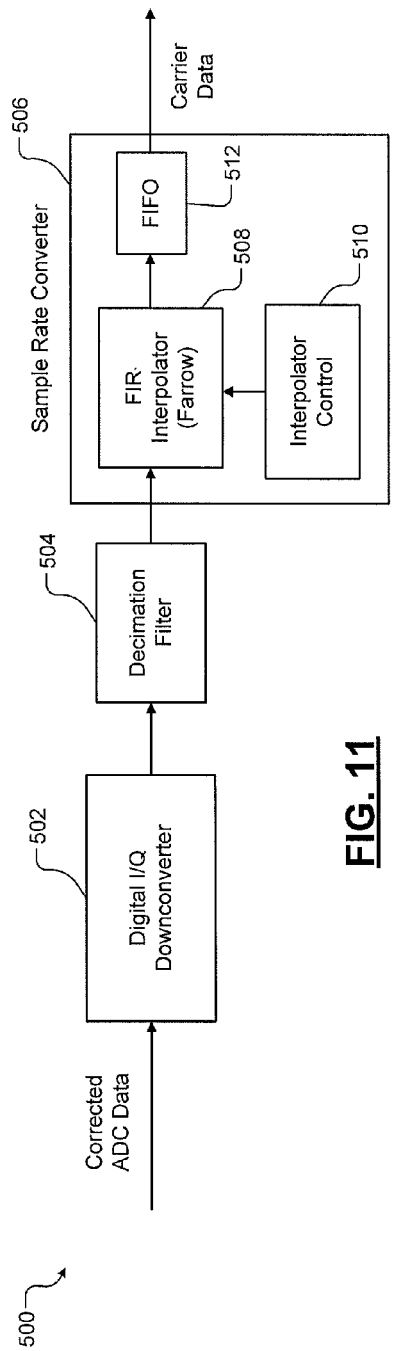
FIG. 11 depicts an example of a sampling rate conversion (SRC) system.
Figure 12:
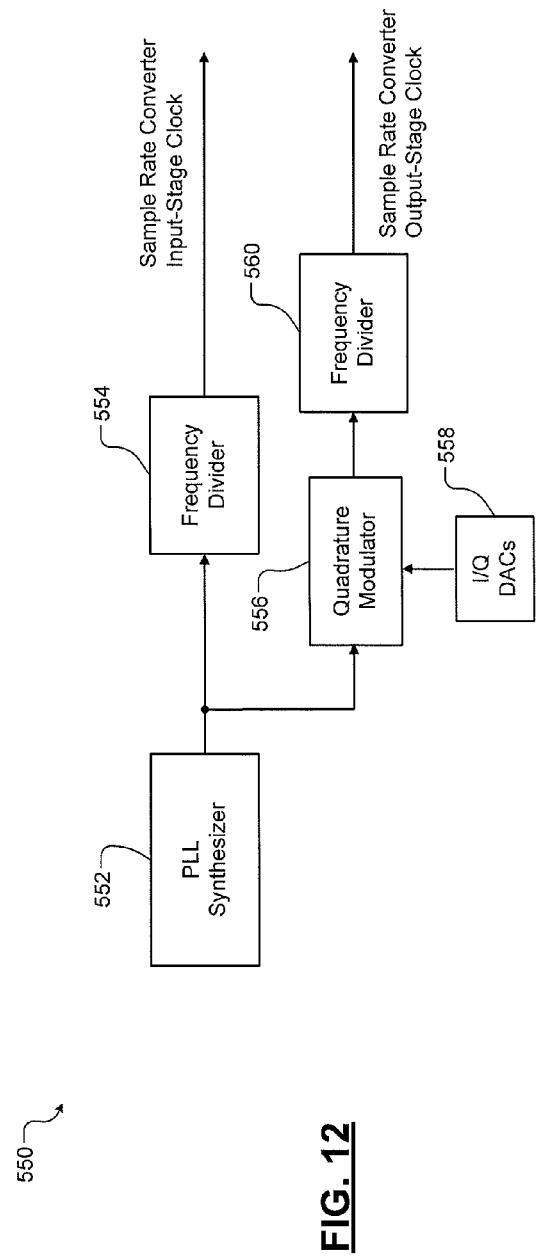
FIG. 12 depicts an example of a clock generator for the sampling rate converter system of FIG. 11.

FIGS. 11 and 12 show adaptive sampling frequency hopping. Specifically, FIG. 11 shows an example of a sampling rate conversion (SRC) system, and FIG. 12 shows an example of a clock generator for the sampling rate converter. High-speed and high-resolution time-interleaved ADCs require demanding accuracy for error detection and correction. Blind detection of sub-ADC mismatches directly from the ADC output data is used to achieve very high accuracy. However, blind detection may not work if the ADC input signal or the square of the input signal contains continuous wave (CW) tones located exactly at frequencies that are a multiple of $F_s/M$. The limitations of blind detection can be avoided by properly selecting the sampling frequency $F_s$ of the ADC.

FIG. 11 shows an example of a sampling rate conversion (SRC) system 500. The SRC system 500 includes a digital I/Q (quadrature) downconverter 502, a decimation filter 504, and a sampling rate converter (SRC) 506. The SRC 506 includes an FIR interpolator 508, an interpolator controller 510, and a first-in-first-out (FIFO) buffer 512.

The digital quadrature downconverter 502 and the decimation filter 504 are used at the output of the time-interleaved ADC 102 to select a number of carriers at different center frequencies. Polyphase FIR filters and cascaded-integrator-comb filters are commonly used as decimation filters, which typically have integer decimation factors. In many applications, the sampling rate of an output carrier is required to be a fixed number, e.g., 30.72 MS/s for a 20-MHz LTE carrier. With integer decimation factors, the sampling rate of the time-interleaved ADC 102 has to be an integer multiple of the carrier sampling rate.

For more flexibility in selecting ADC sampling rates, the digital SRC 506 is cascaded with the decimation filter 504. The SRC 506 uses a polynomial-coefficients FIR interpolator 508 in Farrow structure and the FIFO buffer 512. The Farrow structure is used to implement time-varying fractional-delay FIR. The interpolator controller 510 controls the FIR interpolator 508.

The output stage of the SRC 506 works at a different clock frequency than the input stage. When the relative difference between the clock frequencies of the input and output stages of the SRC 506 is small, clock generation for the SRC 506 can be difficult. Phase-locked-loop (PLL) frequency synthesizers including a voltage-controlled oscillator (VCO) are commonly used for ADC clocking. The ADC chip allows for at most one VCO running on the ADC chip. Otherwise interactions between oscillators can enhance ADC clock jitter and severely degrade ADC performance.

FIG. 12 shows an example of a clock generator 550 that uses a single PLL frequency synthesizer to generate clock signals for both the time-interleaved ADC 102 and the input and output stages of the SRC 506. The clock generator 550 includes a PLL synthesizer 552 having a single VCO, a first frequency divider 554, a quadrature modulator 556, an I/Q digital-to-analog converter (DAC) 558, and a second frequency divider 560. Together with the I/Q DAC 558, the quadrature modulator 556 is used as a digitally-controlled frequency shifter. In addition to providing clock signals for the time-interleaved ADC 102, the clock generator 550 provides the clock signals for the input and output stages of the SRC 506 as follows.

In simplified analysis, the input of the quadrature modulator 556 (or the output of the PLL synthesizer 552) is a sinusoidal signal $\sin(2\pi ft+\phi)$. The outputs of the I/Q DAC 558 are respectively $\cos(2\pi\Delta t)$ and $\sin(2\pi\Delta t)$. The output of the quadrature modulator 556 is $\sin[2\pi(f+\Delta)t+\phi]$. This arrangement can provide at least up to a 100-MHz frequency shift for a multi-GHz sinusoid.

The first and second frequency dividers 554 and 560 divide the frequencies of the outputs of the PLL synthesizer 552 and the quadrature modulator 556 by the same value to generate the SRC input-stage and output-stage clocks. Non-idealities of the quadrature modulator 556, such as I/Q imbalance and local oscillator (LO) leakage, can cause deterministic jitter in the clock signal of the output-stage of the SRC 506. In typical circuit conditions, however, the deterministic jitter is negligibly small as compared to a clock period of the SRC 506.

In FIG. 1, the ADC data analyzer 106 can recognize difficult cases for blind detection (e.g., when the ADC input signal includes blockers at frequencies that are a multiple of $F_s/M$) and adaptively change the ADC sampling frequency through PLL switching. In most cases, a small variation of sampling frequency, e.g., 10-100 ppm, is sufficient. The switching speed of the PLL synthesizer 552 depends on the spacing of the frequency hop (i.e., an amount by which the ADC sampling frequency is shifted in response to blockers being present in the input signal).

For example, suppose that the loop bandwidth of the PLL synthesizer 552 is 30-kHz and the frequency hop is 300 kHz. Then the switching time of the PLL synthesizer 552 is no more than 0.1 ms. The present disclosure proposes using a 10-100 ppm variation in the ADC sampling frequency per hop. The PLL synthesizer 552 includes a voltage controlled oscillator (VCO). The ADC data analyzer 106 may include a model generator that generates a model of the PLL synthesizer 552. From the model, the ADC data analyzer 106 can predict a variation in VCO frequency with time during PLL switching.

For example, in a second-order PLL model, the frequency error varied as a function of time, $f_e(t)$, can be approximately modeled as $f_e(t)=(\Delta f)\exp(-t\omega_n\zeta)$, where $\Delta f$ is the frequency hop, $\omega_n$ is the natural frequency of the loop, and $\zeta$ is the damping factor. Based on the predicted VCO frequency/phase variation with time, the SRC 506 can dynamically adjust its rate conversion ratio during PLL switching without interrupting the ADC operation. Adaptive sampling frequency hopping is particularly useful when the time-interleaved ADC 102 is used as a radio receiver where CW one-tone or two-tone blockers can appear at unwanted frequencies.

Although the spacing of frequency hop is small (e.g., <100 ppm), the accumulated change in the ADC sampling frequency after multiple hops can be as large as a maximum allowed frequency shift of the frequency shifter. There is a special case of frequency hopping, where the ADC sampling frequency simply switches back-and-forth between two values. This special case is sampling frequency dithering.

Figure 13:
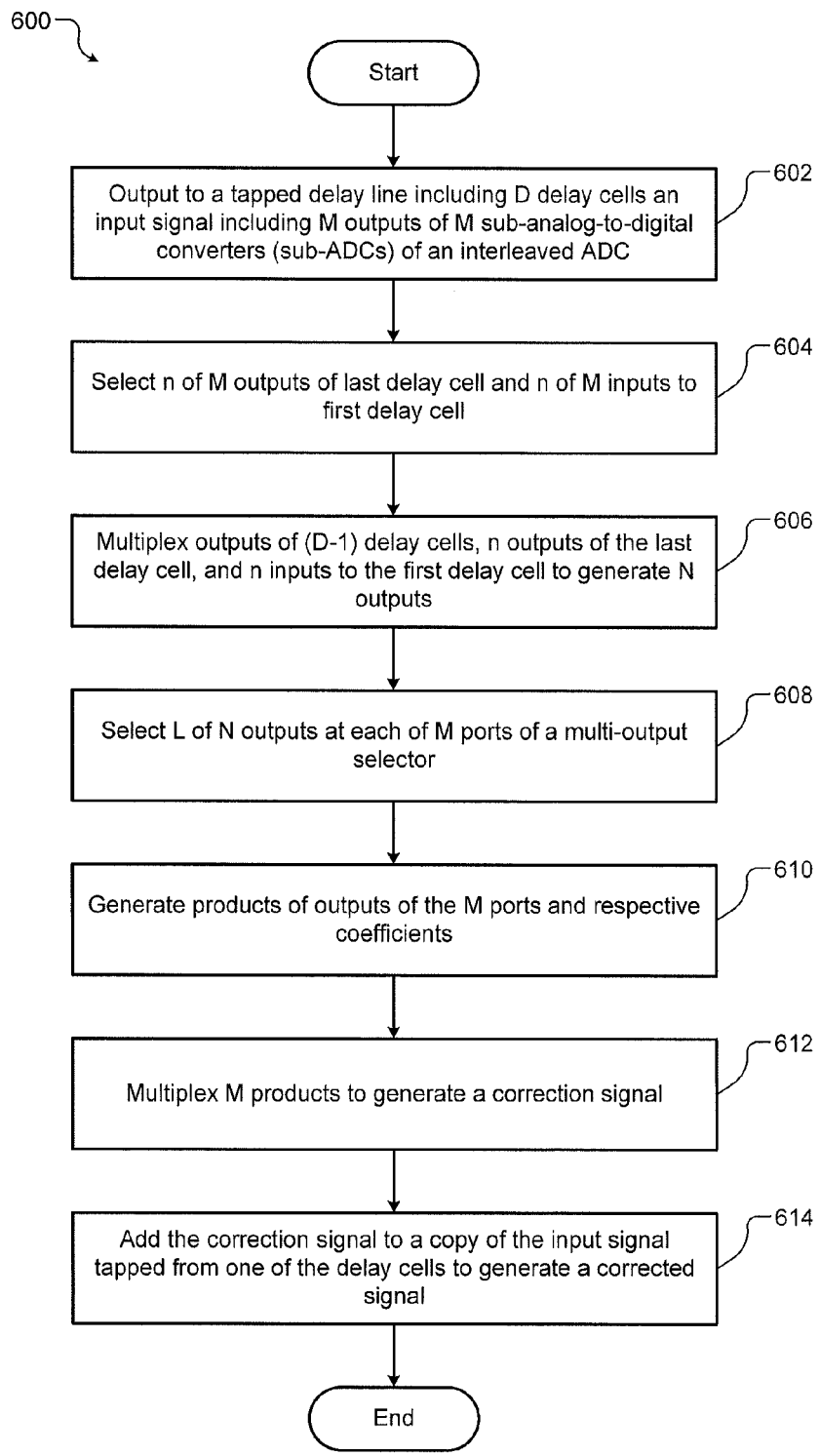
FIG. 13 is a flowchart of a method for correcting mismatches in a time-interleaved ADC using a multiple-input multiple-output (MIMO) filter.

FIG. 13 shows a method 600 for correcting mismatches in a time-interleaved ADC using a multiple-input multiple-output (MIMO) filter. At 602, an input signal including M outputs of M sub-analog-to-digital converters (sub-ADCs) of a time-interleaved ADC are input to a tapped delay line including D delay cells, which may be even in number. At 604, n of the M outputs of a last delay cell and n of the M inputs to a first delay cell are selected. At 606, outputs of the first (D−1) of the D delay cells, the n outputs of the last delay cell, and the n inputs to the first delay cell are multiplexed to generate N outputs, which are input to a multi-port selector having M ports. At 608, L of the N outputs are selected at each of the M ports of the multi-port selector. At 610, products of outputs of the M ports and respective coefficients are generated. At 612, the M products are multiplexed to generate a correction signal. At 614, the correction signal is added to a copy of the input signal tapped from one of the delay cells to generate a corrected signal.

Figure 14:
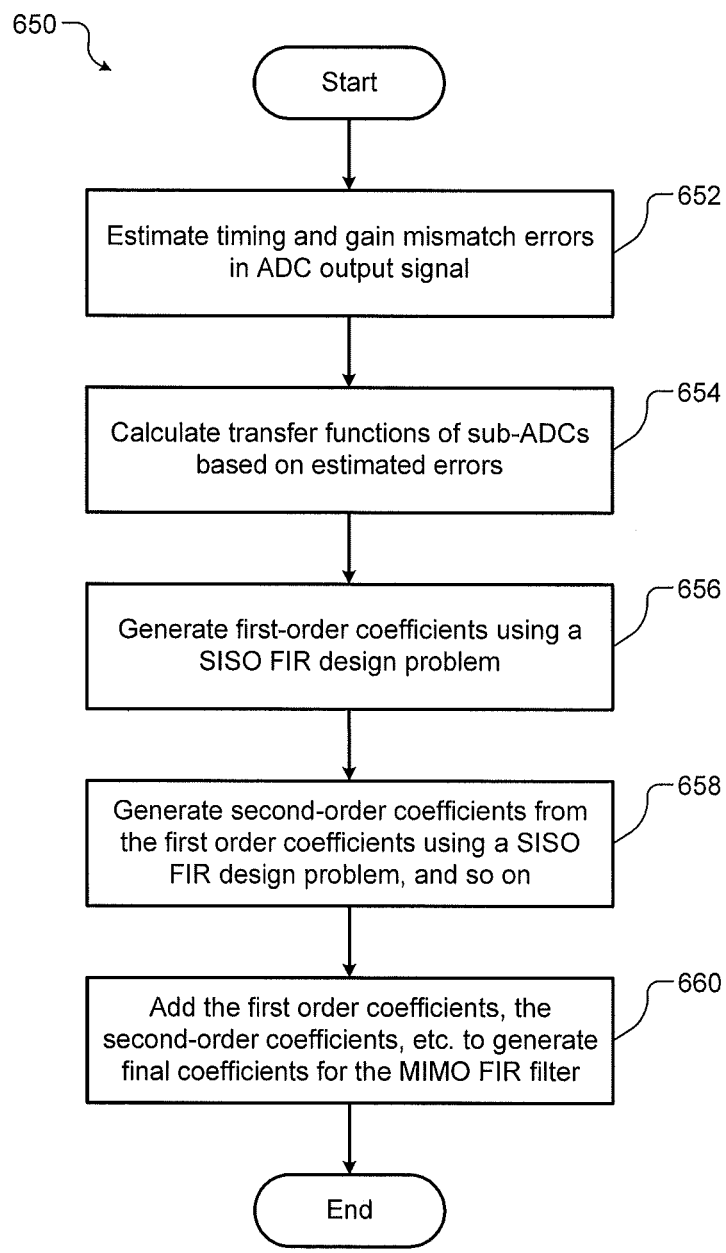
FIG. 14 is a flowchart of a method for generating coefficients used by the MIMO filter in the method of FIG. 13.

FIG. 14 shows a method 650 for generating the coefficients used by the MIMO filter in the method 600. At 652, timing and gain mismatch errors in the ADC output signal are estimated. At 654, transfer functions of the sub-ADCs are calculated based on the estimated errors. At 656, first-order coefficients are generated using a first group of SISO FIR design problems. At 658, second-order coefficients are generated from the first order coefficients using a second group of SISO FIR design problems, and so on. At 660, the first order coefficients, the second order coefficients, and so on are added to generate final coefficients for the MIMO filter used in the method 600.

Figure 15:
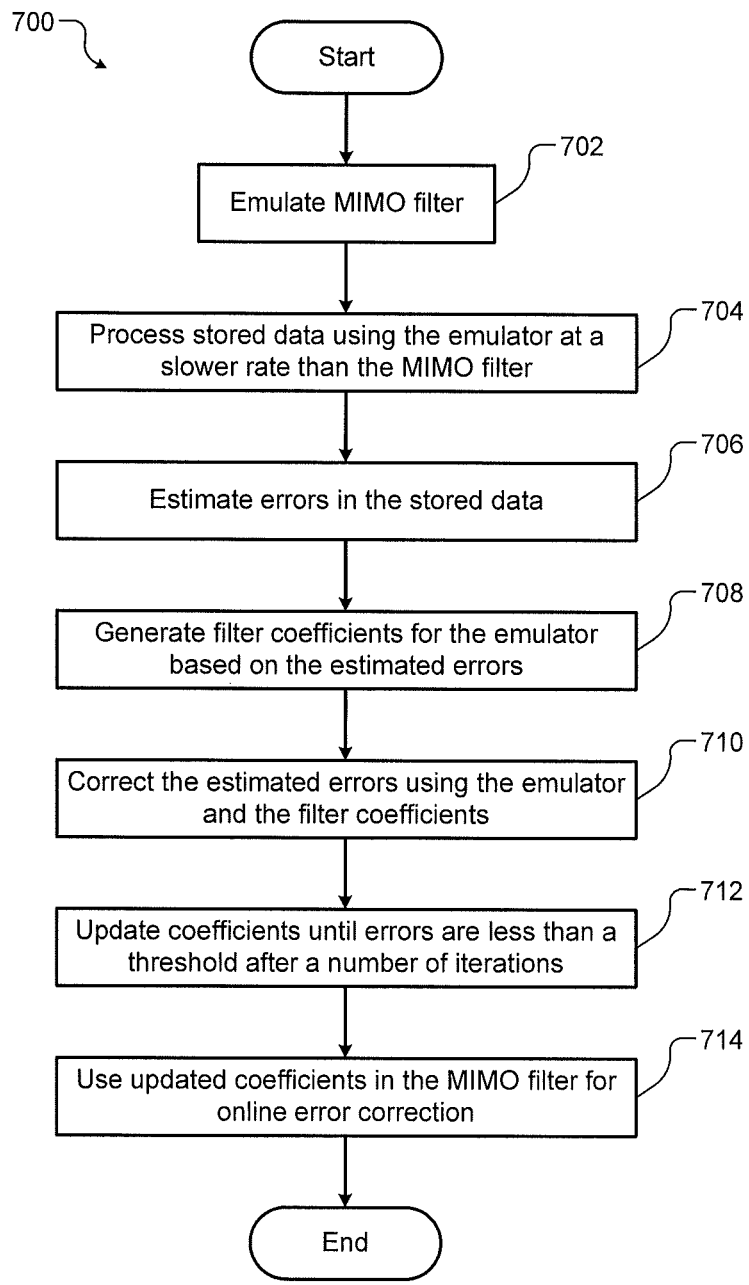
FIG. 15 is a flowchart of a method for generating the coefficients for the MIMO filter used in the method of FIG. 13 by emulating the MIMO filter.

FIG. 15 shows a method 700 for generating the coefficients for the MIMO filter used in the method 600 by emulating the MIMO filter. At 702, the MIMO filter used in the method 600 is emulated. At 704, stored output data of the time-interleaved ADC is processed using the emulator at a lower rate than the MIMO filter used in the method 600. At 706, timing and gain mismatch errors in the output of the time-interleaved ADC are estimated. At 708, filter coefficients for the emulator are generated based on the estimated errors. At 710, the estimated errors are corrected using the emulator and the filter coefficients. At 712, the coefficients are updated until the errors are reduced to less than a threshold after a number of iterations. At 714, the updated coefficients are output to the MIMO filter for online error correction in the method 600.

Figure 16:
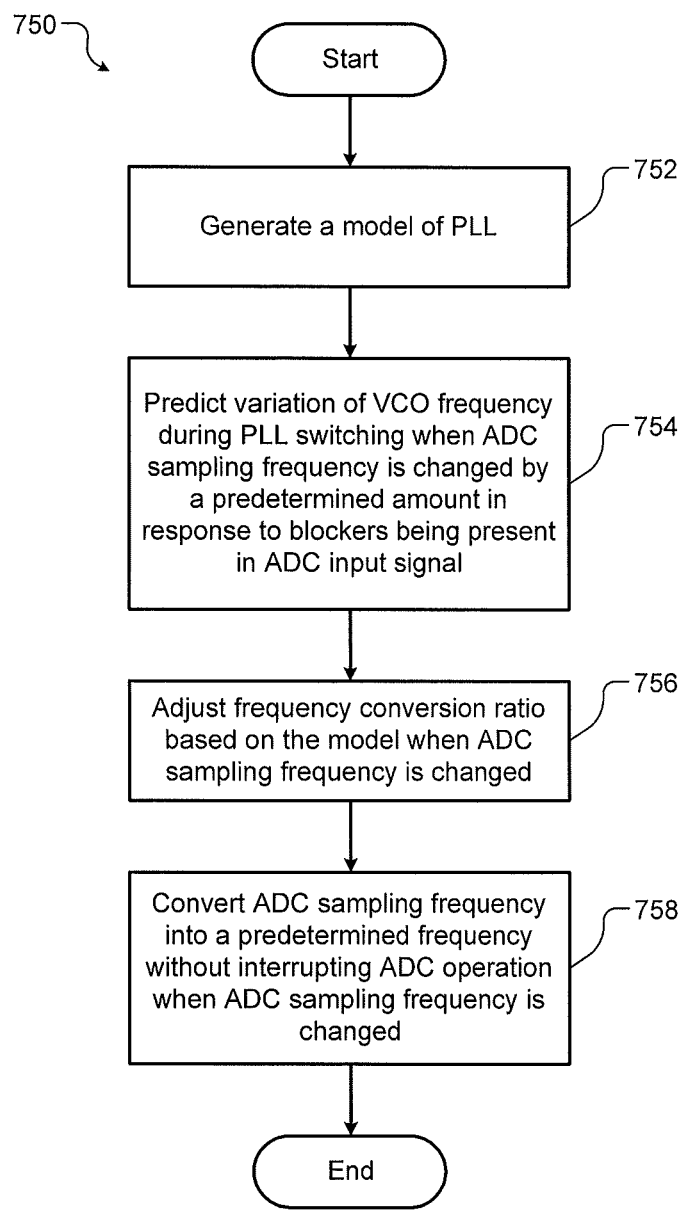
FIG. 16 is a flowchart of a method for adaptive sampling frequency hopping for the time-interleaved ADC shown in FIGS. 1 and 8.

FIG. 16 shows a method 750 for adaptive sampling frequency hopping for a time-interleaved ADC. At 752, a model is generated of a PLL frequency synthesizer including a voltage controlled oscillator (VCO). The PLL frequency synthesizer is used to generate clock signals for the ADC and for a sampling rate converter that converts an ADC sampling frequency into a predetermined frequency. At 754, a variation of a VCO frequency during PLL switching is predicted, where the predicted variation may occur when the ADC sampling frequency is changed by a predetermined amount in response to blockers being detected in the ADC input signal. At 756, a frequency conversion ratio of the sampling rate converter is adjusted based on the model when the ADC sampling frequency is changed in response to detecting blockers in the ADC input signal. At 758, ADC sampling frequency is converted into the predetermined frequency without interrupting the operation of the ADC when the ADC sampling frequency is changed in response to detecting blockers in the ADC input signal.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A multiple-input multiple-output (MIMO) filter comprising:
   a delay line including D delay cells that receives an input signal including M outputs of M sub-analog-to-digital converters (sub-ADCs) of an interleaved ADC, where D and M are integers greater than 1;
   a first selector that selects n of M outputs of a last one of the D delay cells;
   a second selector that selects n of M inputs of a first one of the D delay cells;
   a first multiplexer that multiplexes outputs of the first and second selectors and (D−1) of the D delay cells and that generates N outputs, where N=(D−1)M+2n, and $1 \leq n \leq M$;
   a third selector that has M output ports each selecting L of the N outputs, where L=N+1−M;
   M product generators each generating a product of an output of one of the M output ports and a corresponding coefficient;
   a second multiplexer that multiplexes M products of the M product generators and that generates a correction signal to correct errors in the input signal; and
   an adder that adds the correction signal to an output of one of the D delay cells to generate a corrected signal.

2. The MIMO filter of claim 1 wherein the delay line is a tapped delay line, wherein each delay cell is a unit delay cell, and wherein D is an even number.

3. The MIMO filter of claim 1 wherein each of the M output ports of the third selector sequentially selects L of the N outputs.

4. The MIMO filter of claim 1 further comprising an estimator that estimates the errors and that determines an order of the coefficients based on the estimated errors.

5. The MIMO filter of claim 1 further comprising a coefficient generator that generates first order coefficients for a group of single-input single output (SISO) filters and that generates higher order coefficients for the MIMO filter iteratively from the first order coefficients.

6. The MIMO filter of claim 1 further comprising a coefficient generator that generates the coefficients using a QR-decomposition performed once for a single-input single output (SISO) component of the MIMO filter.

7. The MIMO filter of claim 1 further comprising:
   an estimator that estimates the errors;
   a transfer function calculator that calculates transfer functions of the sub-ADCs based on the estimated errors;
   a first coefficient generator that generates first order coefficients for a group of single-input single output (SISO) filters;
   a second coefficient generator that generates second order coefficients from the first order coefficients; and
   a summing circuit that sums the first and second order coefficients to generate the coefficients for the MIMO filter.

8. The MIMO filter of claim 1 further comprising an estimator that estimates a timing mismatch in the input signal when the errors depend on a frequency of a signal being converted by the interleaved ADC, the estimator comprising:
   a multi-band stop filter that selects out-of-band components from outputs of the M sub-analog-to-digital converters (sub-ADCs) of an interleaved ADC;
   a single-band differentiator that includes a wideband differentiator cascaded with a bandpass filter with a passband tunable to a number of non-overlapping frequency regions; and
   a correlator that correlates the outputs of the multi-band stop filter and the single-band differentiator to generate estimates of the timing mismatch in the errors.

9. The MIMO filter of claim 8 wherein the multi-band stop filter includes a type-I linear phase finite impulse response (FIR) filter having an odd length and symmetric coefficients and wherein the single-band differentiator includes a type-III linear phase FIR filter having an odd length and asymmetric coefficients.

10. The MIMO filter of claim 1 further comprising an estimator that estimates a gain mismatch in the input signal when the errors depend on a frequency of a signal being converted by the interleaved ADC, the estimator comprising:
    a multi-band stop filter that selects out-of-band components from outputs of the M sub-analog-to-digital converters (sub-ADCs) of an interleaved ADC;
    a single-band-pass filter tunable to a number of non-overlapping frequency regions; and
    a correlator that correlates the outputs of the multi-band stop filter and the single-band-pass filter to generate estimates of the gain mismatch in the errors.

11. The MIMO filter of claim 10 wherein the multi-band stop filter includes a type-I linear phase finite impulse response (FIR) filter having an odd length and symmetric coefficients and wherein the single-band-pass filter includes a type-I linear phase FIR filter.

12. The MIMO filter of claim 1 further comprising:
an estimator that estimates mean and variance of the outputs of the M sub-ADCs;
an analyzer that analyzes the corrected signal and the estimates of the mean and variance of the outputs of the M sub-ADCs and that generates offset corrections for the outputs of the M sub-ADCs; and
an offset corrector that corrects offsets in the outputs of the M sub-ADCs based on the offset corrections and that generates the input signal.

13. The MIMO filter of claim 12 wherein the analyzer analyzes the corrected signal by buffering and processing the corrected signal every T seconds and updates the offset corrections and the coefficients after every T seconds to correct the errors.

14. The MIMO filter of claim 1 further comprising:
an estimator that estimates mean and variance of the outputs of the M sub-ADCs;
an offset corrector that corrects offsets in the outputs of the M sub-ADCs and that generates the input signal; and
an analyzer that analyzes the input signal and the estimates of the mean and variance of the outputs of the M sub-ADCs and that generates offset corrections for the offset corrector to correct the offsets in the outputs of the M sub-ADCs.

15. The MIMO filter of claim 14 wherein the analyzer analyzes the input signal by buffering and processing the input signal every T seconds and updates the offset corrections and the coefficients after every T seconds to correct the errors.

16. The MIMO filter of claim 14 further comprising:
an emulator that emulates the MIMO filter and that processes stored data of the input signal at a lower processing rate than the MIMO filter;
an estimator that estimates errors in the stored data; and
a coefficient generator that generates filter coefficients for the emulator based on the estimated errors,
wherein the emulator uses the filter coefficients to correct the errors in the stored data and stores the corrected input signal,
wherein the estimator estimates errors in the corrected input signal,
wherein the coefficient generator updates the filter coefficients based on the errors in the corrected input signal, and
wherein the MIMO filter uses the updated coefficients as the coefficients to correct the errors in the input signal.

17. The MIMO filter of claim 14 wherein the interleaved ADC samples a signal at a sampling frequency, the MIMO filter further comprising:
a converter that converts the sampling frequency into a predetermined frequency and that changes the sampling frequency without changing the predetermined frequency in response to the signal including an unwanted signal at a multiple of the sampling frequency,
wherein the interleaved ADC converts the signal without interruption during the change in the sampling frequency.

18. The MIMO filter of claim 17 wherein the converter changes the sampling frequency by a predetermined amount, the MIMO filter further comprising:
a phase-locked loop (PLL) frequency synthesizer that includes a voltage controlled oscillator (VCO) to generate clock signals for the interleaved ADC and the converter; and
a model generator that generates a model of the PLL frequency synthesizer and that predicts a variation of a VCO frequency with time during switching of the PLL frequency synthesizer when the sampling frequency changes by the predetermined amount,
wherein the converter adjusts a frequency conversion ratio based on the model during the switching of the PLL frequency synthesizer without interrupting the interleaved ADC.

* * * * *